United States Patent [19]
Kong

[11] Patent Number: 5,982,657
[45] Date of Patent: Nov. 9, 1999

[54] CIRCUIT AND METHOD FOR BIASING THE CHARGING CAPACITOR OF A SEMICONDUCTOR MEMORY ARRAY

[75] Inventor: Kah Chin Kong, Singapore, Singapore

[73] Assignee: Texas Instruments Incorporated, Dallas, Tex.

[21] Appl. No.: 08/993,804

[22] Filed: Dec. 18, 1997

[51] Int. Cl.[6] .................................................. G11C 11/24
[52] U.S. Cl. ............................................. 365/149; 365/96
[58] Field of Search ................................. 365/149, 94, 96

[56] References Cited

U.S. PATENT DOCUMENTS

Re. 32,236   8/1986   Scheuerlein ........................... 365/149
3,387,286    6/1968   Dennard ................................. 365/149

*Primary Examiner*—Terrell W. Fears
*Attorney, Agent, or Firm*—Robby T. Holland; Carlton H. Hoel; Richard L. Donaldson

[57] ABSTRACT

The cathode of the charging capacitor (31) of the present invention is coupled to a switch (36) that is able to apply one of several voltage levels to the cathode depending on the testing or use condition of the semiconductor memory array (10). The switch switches between the voltage levels at the cathode to avoid overstressing the charging capacitor (31) during testing of the semiconductor memory array (10).

10 Claims, 1 Drawing Sheet

CIRCUIT AND METHOD FOR BIASING THE CHARGING CAPACITOR OF A SEMICONDUCTOR MEMORY ARRAY

This is a Non Provisional application filed under 35 USC 119(e) and claims priority of the Singapore application, Ser. No. 9701119-1, filed: Apr. 10, 1997 of inventor Kong.

TECHNICAL FIELD OF THE INVENTION

This invention relates in general to the field of memory devices, and more particularly to a circuit and method for biasing the charging capacitor of a semiconductor memory array.

BACKGROUND OF THE INVENTION

The peripheral circuitry of a semiconductor memory array often includes a charging capacitor coupled between a reference voltage and ground. The stored charge of the charging capacitor is passed through the word line decoding circuits and word line detection circuits to charge the reference capacitors of the memory cells of the word line or word lines selected by the decoding and detection circuits. Because the charging capacitor must provide a reference voltage to each word line in the memory array, the charging capacitor often has a large surface area and is prone to failure upon the application of a sufficiently high voltage differential across the plates of the charging capacitor. The charging capacitor may also be coupled to ground from an oxide layer common to other components of the semiconductor memory array, including the gates of transistors in the memory. As a result, failure in these other components also connected between the common oxide layer and ground will result in failure of the charging capacitor as well.

Conventionally, the charging capacitor is biased during operation and testing by placing a reference voltage at the anode of the capacitor and grounding the cathode of the capacitor. During the testing of DRAM semiconductor memories, the voltage level applied to the word lines of the memory array is raised for an extended period. During burn-in testing, for example, the voltage applied to each word line is elevated from a normal level to a higher voltage for an extended period, possibly 20 hours or longer. Other testing modes are possible, including operating-life testing. As compared to the voltage applied during burn-in testing, the voltage applied to the word lines during operating-life testing is lower but is applied for a longer period, possibly 1000 hours or longer. Burn-in testing and operation-life testing are necessary to insure an adequate length of operating life for the semiconductor memory device. Each of these testing modes employs accelerated operating conditions over shorter period to simulate the effects of normal operating conditions over a longer period.

Because the charging capacitor may share the same oxide layer as the gates of the memory array, the elevated voltages applied to the word lines of the memory array during testing are also applied to the anode of the charging capacitor during the entire testing sequence. Thus, imperfections in the oxide layer shared between the transfer gates and the charging capacitor are often manifested in a failure of the charging capacitor. Unlike each word line of the semiconductor memory array, however, the charging capacitor is stressed during the entire testing sequence as the entire elevated testing voltage is applied at the anode of the charging capacitor, often resulting in excessive failure rates of the charging capacitor due to inadequate testing parameters.

SUMMARY OF THE INVENTION

In accordance with the present invention, a circuit and method for biasing the charging capacitor of a semiconductor memory array is provided that substantially reduces or eliminates the problems and disadvantages of prior methods of biasing charging capacitors of semiconductor memory arrays.

The cathode of the charging capacitor of the present invention is coupled to a switch that is able to switch the cathode to one of several voltage levels depending on the testing or use condition of the semiconductor memory array. The voltage levels that may be connected to the cathode are derived independently of the reference voltages applied at the anode of the charging capacitor. The switch switches between the voltage levels at the cathode to avoid overstressing the charging capacitor during testing of the semiconductor memory array. The switchable voltage levels at the cathode are graduated to insure that the differences in acceleration factor between successive testing or use conditions are sufficiently great to test the integrity of the charging capacitor itself.

A technical advantage of the present invention is a provision of a circuit and method for biasing a charging capacitor in which the differential voltage applied to the charging capacitor is adjustable depending on the testing or use condition of the semiconductor memory array.

Another technical advantage of the present invention is the provision of a circuit and method for preventing a charging capacitor from becoming overstressed during testing of the semiconductor memory array.

Still another technical advantage of the present invention is the provision of a circuit and method for biasing a charging capacitor that insures an adequate difference in acceleration factors between the successive testing or use conditions to insure the adequate testing of the charging capacitor itself.

BRIEF DESCRIPTION OF THE DRAWINGS

A more complete understanding of the present invention and advantages thereof may be acquired by referring to the following description taken in conjunction with the accompanying drawing in which like reference numbers indicate like features, and wherein.

DETAILED DESCRIPTION OF THE INVENTION

Figure 1:
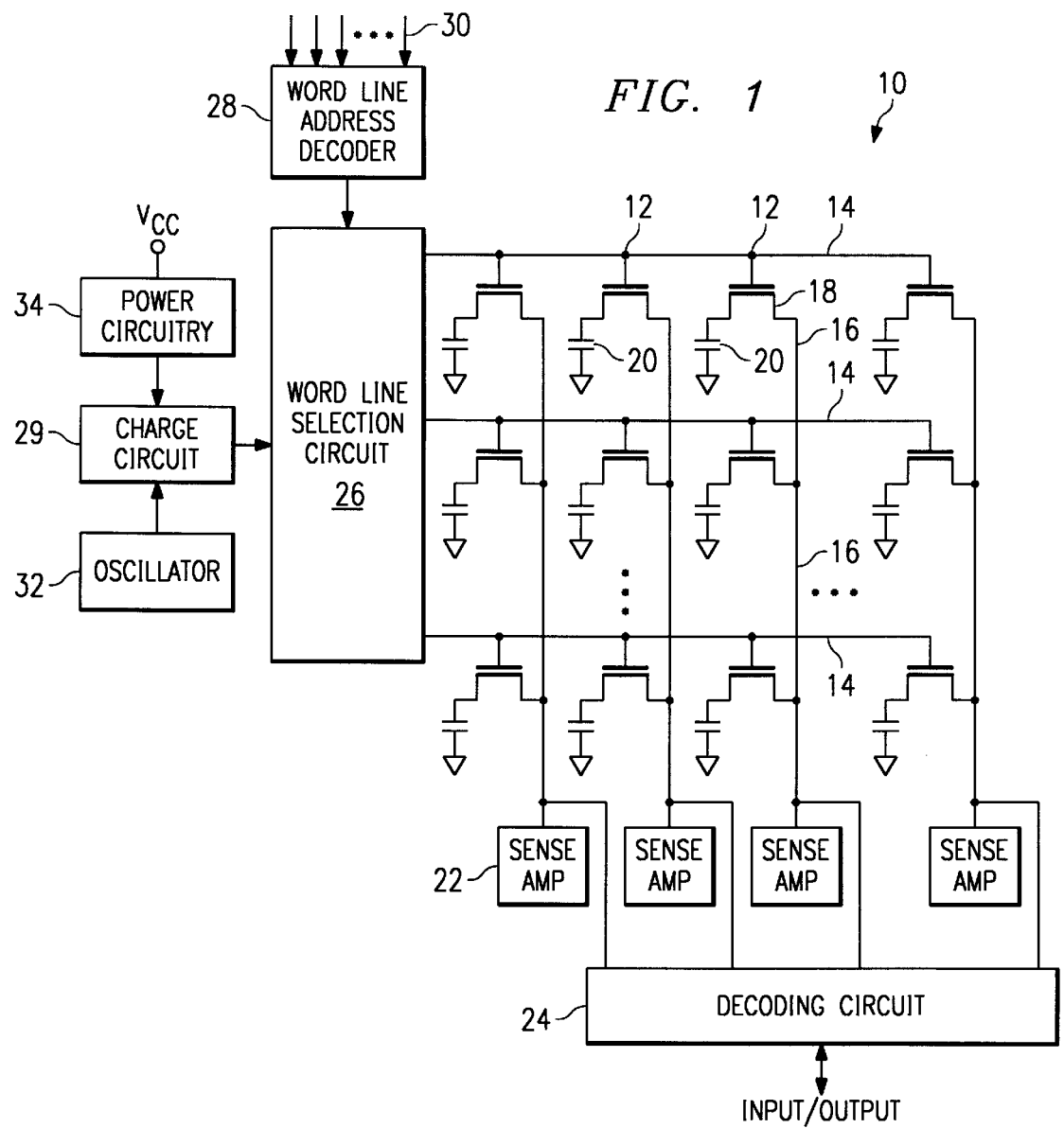
FIG. 1 is a diagram of the semiconductor memory array of the present invention.

Referring to FIG. 1, a dynamic random access memory (DRAM) device, indicated generally at 10, is provided. DRAM 10 includes a plurality of memory cells 12, each at the intersection of a word line 14 and a bit line 16. Each memory cell 12 includes a MOS transistor 18. The gate of each MOS transistor 18 is coupled to a word line 14 and the drain of each MOS transistor 18 is coupled to a bit line 16. The source of each MOS transistor 18 is coupled to ground through an access capacitor 20. Data is stored in each memory cell 12 in the form of a charge stored in access capacitor 20. A logic 1 may be stored by charging access capacitor 20 to a higher voltage and a logic 0 may be stored by discharging access capacitor 20 to a lower voltage. Each bit line 16 is coupled to a sense amplifier 22 and a column decoder 24.

Each word line 14 is coupled to a word line selection circuit 26. Word line selection circuit 26 is coupled to a word line address decoder 28. The inputs of word line address decoder 28 are a plurality of word line inputs 30. Word line address decoder 20 decodes the word line inputs 30 and outputs an address to word line selection circuit 26, which energizes one of more of word lines 14 on the basis of the word line inputs 30 provided at the input of the word line selection circuit 26.

Also coupled to the input of word line selection circuit 26 is the output of DRAM charge circuit 29. The purpose of charge circuit 29 is to hold a positive charge that can be passed through word line selection circuit 26 to any of word lines 14. When a word line 14 is selected during a READ or WRITE operation, the capacitive charge of charge circuit 29 is passed to the selected word line 14 to cause all the transistors 18 of the selected word line 14 to become conductive. Charge circuit 29 includes a charging capacitor 31 (not shown in FIG. 1).

Charge circuit 30 includes as inputs oscillator 32 and voltage reference circuit 34. Voltage reference circuit 34 includes reference voltage $V_{cc}$ as an input. Voltage reference circuit 34 sets a reference voltage $V_{pp}$, which is derived from $V_{cc}$. Oscillator 32 provides a time-varying input to charge circuit 30 to maintain the charge $V_{cc}$ applied to charging capacitor 31. Oscillator 32 oscillates at a very high frequency to maintain charging capacitor 31 at a near static voltage level, preventing charge from leaking from charging capacitor 31.

Figure 2:
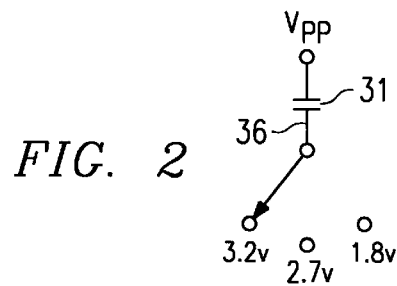
FIG. 2 is a diagram of the charging capacitor of the present invention.

A more detailed illustration of charging circuit 30 of the present invention is shown in FIG. 2. Voltage $V_{pp}$ is coupled to the anode of charging capacitor 31. Because charging capacitor 31 must maintain a large reservoir of charge, the physical size of charging capacitor 31 is typically very large. Voltage $V_{pp}$ is the voltage provided by the output of voltage reference circuit 34. The cathode of charging capacitor 31 is coupled through a switch 36 to one of several voltage levels. As shown in the embodiment of FIG. 2, the cathode voltage is switchable between one of three voltage levels: 3.2 volts, 2.7 volts, and 1.8 volts. Each of these reference voltage levels may be derived from a stable reference voltage on the DRAM semiconductor, such as the output of voltage reference circuit 34.

During burn-in testing, an elevated voltage is applied to each word line 14 to test the integrity of the word line 14 during stressed operating conditions. Each word line 14 may be stressed to an elevated voltage level for a period of 20 hours or more. A typical voltage applied to each word line 14 during burn-in testing is 8 volts. Other voltages levels, for burn-in are possible. According to one embodiment of the present invention, switch 36 switches the voltage level of the cathode to the highest of the three voltage levels, 3.2 volts. In this manner, the voltage level of 8 volts at the anode of charging capacitor 31 is passed through word line selection circuit 26 to word lines 14 during burn-in testing, while the voltage differential applied across charging capacitor 31 is reduced to 4.8 volts.

During operating-life testing an elevated voltage is applied to each word line to test the integrity of the word line 14 during stressed operating conditions. Unlike burn-in testing, however, the applied voltage during operating-life testing is lower, typically 7 volts at the anode of charging capacitor 31 and word lines 14. The elevated voltage level is applied to anode 31 and word lines 14 during operating-life for 1000 hours or longer. During operation-life testing, according to one embodiment of the invention, switch 36 switches the voltage level of the cathode of charging capacitor 31 to 2.7 volts, the intermediate level of the three voltage levels. According to the teachings of the present invention, the voltage level of 7 volts is passed through word line selection circuit 26 to word lines 14, while the voltage differential applied across charging capacitor 31 is reduced to 4.3 volts.

During the use, or normal operating, condition, switch 36 switches the voltage level of the cathode of charging capacitor 31 to 1.8 volts, the lowest of the switchable voltage levels. A voltage level sufficient to turn on MOS transistors 18 of the memory cells 12 of word lines 14, typically 5.2 volts, is applied at the anode of charging capacitor 31. The voltage differential between the anode and cathode of charging capacitor 31 is 3.4 volts. Alternatively, the voltage applied at the cathode during use condition could be lower than 1.8 volts, such as when the cathode is coupled to ground.

According to the teachings of the present invention, the provision of a switchable voltage level at the cathode of charging capacitor 31 allows the voltage level at the cathode to track the voltage level at the anode, thereby preventing the application of a large voltage differential across charging capacitor 31. The application of varying voltage levels at the cathode of charging capacitor 31 does not affect the voltage level applied to word lines 14 during burn-in, operation-life, or use conditions. The voltage levels applied at the cathode are established independently of the voltage applied at the anode of charging capacitor 31. In this manner, the voltage applied at the cathode may be varied independently of the voltage applied at the anode of charging capacitor 31.

In addition, the graduated voltage levels applied to the cathode of charging capacitor allow for adequate testing of charging capacitor 31 and insure that charging capacitor 31 experiences differences in the applied acceleration factor as the operation of DRAM 10 moves from burn-in testing to operation-life testing to use conditions. The acceleration factor is a measure of the voltage differential across the anode and cathode of the charging capacitor 31 divided by the width of the charging capacitor 31. The teachings of the present invention provide for difference in acceleration factor between the burn-in testing stage and the operation-life stage, and between the operation-life stage and the use condition so that charging capacitor 31 experiences a change in the acceleration factor between each stage to insure that the charging capacitor itself is tested.

According to the teachings of the present invention, while the voltage differential between the anode and the cathode of charging capacitor is maintained at a sufficiently low voltage level to prevent failure during burn-in or operation-life testing, the voltage differential between the anode and the cathode must be maintained at a sufficiently high level so that charging capacitor 31 is stressed during burn-in and operation-life testing.

Assume for the purposes of example, that, in a first case involving a typical charging capacitor, during burn-in, operation-life, and use, the anode is coupled to 8 volts, 7 volts, and 5.1 volts, respectively, and the cathode is coupled to ground. The electric field, or acceleration factor, across charging capacitor during burn-in is 6.2 MV/cm. The difference between the acceleration factor during burn-in and operation-life is 0.7 MV/cm, and the difference between the acceleration factor during operation-life and use condition is 1.5 MV/cm. Assume, for a second case, that, instead of coupling the cathode to ground, the voltages of FIG. 2 are applied to the cathode of charging capacitor 31 during burn-in, operation-life, and use condition. In this second example, the acceleration factor across charging capacitor during burn-in is 3.7 MV/cm. The difference between the acceleration factor during burn-in and operation-life is 0.38 MV/cm, and the difference between the acceleration factor during operation-life and use condition is 0.77 MV/cm.

The acceleration factors of the second example as compared with the acceleration factors of the first example demonstrate the efficacy of placing a switchable voltage at the cathode of charging capacitor 31. The acceleration factor across charging capacitor 31 during burn-in is reduced from 6.2 MV/cm to 3.7 MV/cm, thereby eliminating overstresses in charging capacitor 31 during burn-in. In addition, the differences in acceleration factors between each testing state in the second example, although less than that of the first example, is sufficient to insure an adequate operating life of charging capacitor 31.

Although the present invention has been described in terms of a DRAM semiconductor memory device, the teachings of the present device are not limited to DRAM semiconductor memory devices but may also be applied to other semiconductor memory devices having a capacitor for storing a charge to be applied to the semiconductor memory device during testing or use of the device.

Although the present invention has been described in detail, it should be understood that various changes, substitutions and alterations can be made thereto without departing from the spirit and scope of the invention as defined by the appended claims.

What is claimed is:

1. A circuit for biasing a charging capacitor of a semiconductor memory device, comprising:

said charging capacitor having a first electrode electrically coupled to a reference voltage source and the memory cells of the semiconductor memory array;

said charging capacitor having a second electrode coupled to a switch; and said switch operable to couple the second terminal of the charging capacitor to one of a plurality of reference voltages depending on the testing or operating condition of the semiconductor memory device.

2. The circuit of claim 1, wherein the switch is operable to couple the second terminal of the charging capacitor to one of three voltages depending on the testing condition of the semiconductor memory device.

3. The circuit of claim 1, wherein the switch is operable to couple the second terminal of the charging capacitor to a voltage such that the voltage differential across the charging capacitor is about 4.8 volts.

4. The circuit of claim 1, wherein the switch is operable to couple the second terminal of the charging capacitor to a voltage such that the voltage differential across charging capacitor is about 4.3 volts.

5. The circuit of claim 1, wherein the switch is operable to couple the second terminal of the charging capacitor to a voltage such that the voltage differential across charging capacitor is about 3.4 volts.

6. The circuit of claim 1, wherein the switch is operable to couple the second terminal of the charging capacitor to a voltage such that the voltage differential across the charging capacitor is about 4.8 volts;

wherein the switch is operable to couple the second terminal of the charging capacitor to a voltage such that the voltage differential across charging capacitor is about 4.3 volts; and wherein the switch is operable to couple the second terminal of the charging capacitor to a voltage such that the voltage differential across charging capacitor is about 3.4 volts.

7. A method for biasing a charging capacitor of a semiconductor memory array, comprising the steps of:

during burn-in testing, coupling the anode of the charging capacitor to an elevated burn-in voltage and coupling the cathode to a first of a plurality of reference voltages;

during operation-life testing, coupling the anode of the charging capacitor to an elevated operation-life voltage and coupling the cathode to a second of a plurality of reference voltages; and during a use condition, coupling the anode of the charging capacitor to a use voltage and coupling the cathode to a third of a plurality of reference voltages.

8. The method of claim 7, wherein the step of coupling the cathode of the charging capacitor to a first of a plurality of voltages during burn-in testing comprises the step of coupling the cathode of the charging capacitor to a voltage potential of about 3.2 volts during burn-in testing.

9. The method of claim 7, wherein the step of coupling the cathode of the charging capacitor to a second of a plurality of voltages during operation-life testing comprises the step of coupling the cathode of the charging capacitor to a voltage potential of about 2.7 volts during operation-life testing.

10. The method of claim 7, wherein the step of coupling the cathode of the charging capacitor to a third of a plurality of voltages during normal operating conditions comprises the step of coupling the cathode of the charging capacitor to a voltage potential of about 1.8 volts during normal operating conditions.

* * * * *